United States Patent
Loubet et al.

(10) Patent No.: US 9,257,450 B2
(45) Date of Patent: Feb. 9, 2016

(54) SEMICONDUCTOR DEVICE INCLUDING GROUPS OF STACKED NANOWIRES AND RELATED METHODS

(71) Applicants: STMICROELECTRONICS, INC., Coppell, TX (US); INTERNATIONAL BUSINESS MACHINES CORPORATION, Armonk, NY (US)

(72) Inventors: Nicolas Loubet, Guilderland, NY (US); James Kuss, Hudson, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/182,632

(22) Filed: Feb. 18, 2014

(65) Prior Publication Data

US 2015/0236051 A1  Aug. 20, 2015

(51) Int. Cl.
*H01L 29/16* (2006.01)
*H01L 27/12* (2006.01)
*H01L 21/84* (2006.01)
*H01L 29/165* (2006.01)
*H01L 29/06* (2006.01)
*H01L 21/02* (2006.01)

(52) U.S. Cl.
CPC ...... *H01L 27/1211* (2013.01); *H01L 21/02236* (2013.01); *H01L 21/02532* (2013.01); *H01L 21/02603* (2013.01); *H01L 21/02639* (2013.01); *H01L 21/02664* (2013.01); *H01L 21/845* (2013.01); *H01L 29/0673* (2013.01); *H01L 29/16* (2013.01); *H01L 29/165* (2013.01); *H01L 21/02255* (2013.01)

(58) Field of Classification Search
CPC ....... H01L 21/20; H01L 29/775; H01L 29/78; H01L 21/845; H01L 21/02532; H01L 21/02236; H01L 21/02255; H01L 21/02664; H01L 21/02603; H01L 27/1211; H01L 29/16; H01L 29/166; H01L 29/0673
See application file for complete search history.

(56) References Cited

U.S. PATENT DOCUMENTS

| 8,580,624 B2 | 11/2013 | Bangsaruntip et al. | |
| 2010/0164102 A1* | 7/2010 | Rachmady et al. | 257/741 |
| 2010/0295024 A1* | 11/2010 | Pernel et al. | 257/24 |
| 2012/0007051 A1* | 1/2012 | Bangsaruntip et al. | 257/24 |
| 2013/0075797 A1* | 3/2013 | Okano | 257/288 |
| 2013/0270512 A1 | 10/2013 | Radosavljevic et al. | |
| 2014/0151639 A1* | 6/2014 | Chang et al. | 257/27 |
| 2014/0225065 A1* | 8/2014 | Rachmady et al. | 257/24 |

OTHER PUBLICATIONS

U.S. Appl. No. 14/182,601, filed Feb. 18, 2014.

* cited by examiner

*Primary Examiner* — Tan N Tran
*Assistant Examiner* — Fazli Erdem
(74) *Attorney, Agent, or Firm* — Allen, Dyer, Doppelt, Milbrath & Gilchrist, P.A.

(57) ABSTRACT

A method for making a semiconductor device may include forming, above a substrate, a stack of alternating layers of first and second semiconductor materials. The second semiconductor material may be different than the first semiconductor material. The method may further include forming fins from the stack, with each fin having alternating layers of the first and second semiconductor materials, and selectively removing sidewall portions of the second semiconductor material from the fins to define recesses therein. The method may also include forming a dielectric material within the recesses, forming additional first semiconductor material on sidewall portions of the first semiconductor material in the fins, and forming a dielectric layer overlying the fins to define nanowires including the first semiconductor material within the dielectric layer.

15 Claims, 4 Drawing Sheets

SEMICONDUCTOR DEVICE INCLUDING GROUPS OF STACKED NANOWIRES AND RELATED METHODS

FIELD OF THE INVENTION

The present invention relates to the field of electronic devices and, more particularly, to semiconductor devices and related methods.

BACKGROUND OF THE INVENTION

As semiconductor device sizes continue to get smaller, nanowires are becoming a more attractive alternative for interconnecting various device components in relatively small circuits. In addition to their relatively small dimensions, nanowires may exhibit certain properties not found in the same material in bulk form, which may also be advantageous in certain configurations.

One example device which incorporates nanowires is set forth in U.S. Pat. Pub. No. 2013/0270512 to Radosavljevic et al. This reference discloses architectures and techniques for co-integration of heterogeneous materials, such as group III-V semiconductor materials and group IV semiconductors (e.g., Ge) on a same substrate (e.g. silicon). Multi-layer heterogeneous semiconductor material stacks having alternating nanowire and sacrificial layers are employed to release nanowires and permit formation of a coaxial gate structure that completely surrounds a channel region of the nanowire transistor. Individual PMOS and NMOS channel semiconductor materials are co-integrated with a starting substrate having a blanket layers of alternating Ge/III-V layers.

Despite the existence of such configurations, further enhancements in semiconductor devices incorporating nanowires may be desirable in some applications, such as next generation devices with relatively small dimensions.

SUMMARY OF THE INVENTION

A method for making a semiconductor device may include forming, above a substrate, a stack of alternating layers of first and second semiconductor materials. The second semiconductor material may be different than the first semiconductor material. The method may further include forming a plurality of fins from the stack, with each fin having alternating layers of the first and second semiconductor materials, and selectively removing sidewall portions of the second semiconductor material from the fins to define recesses therein. The method may also include forming a dielectric material within the recesses, forming additional first semiconductor material on sidewall portions of the first semiconductor material in the fins, and forming a dielectric layer overlying the plurality of fins to define nanowires comprising the first semiconductor material within the dielectric layer.

More particularly, the stack of alternating layers of first and second semiconductor materials may include a plurality of pairs of layers of alternating first and second materials, and forming the dielectric layer may include forming the dielectric layer to define vertically stacked groups of nanowires comprising the first semiconductor material within the dielectric layer. By way of example, forming the dielectric layer may further include depositing an oxide and thereafter performing a thermal oxidation. Moreover, each of the nanowires may include a residual portion of the second semiconductor material comprising less than 5% of the overall semiconductor material in each nanowire.

The nanowires may have oval-shaped cross-sections. By way of example, the first semiconductor material may comprise silicon, and the second semiconductor material may comprise silicon germanium.

A related semiconductor device may include a substrate, a dielectric layer above the substrate, and a plurality of silicon nanowires within the dielectric layer and each including a residual portion of silicon germanium. The residual portion of silicon germanium may comprise less than 5% by weight of the overall semiconductor material in each nanowire.

DETAILED DESCRIPTION OF THE PREFERRED EMBODIMENTS

Figure 1:
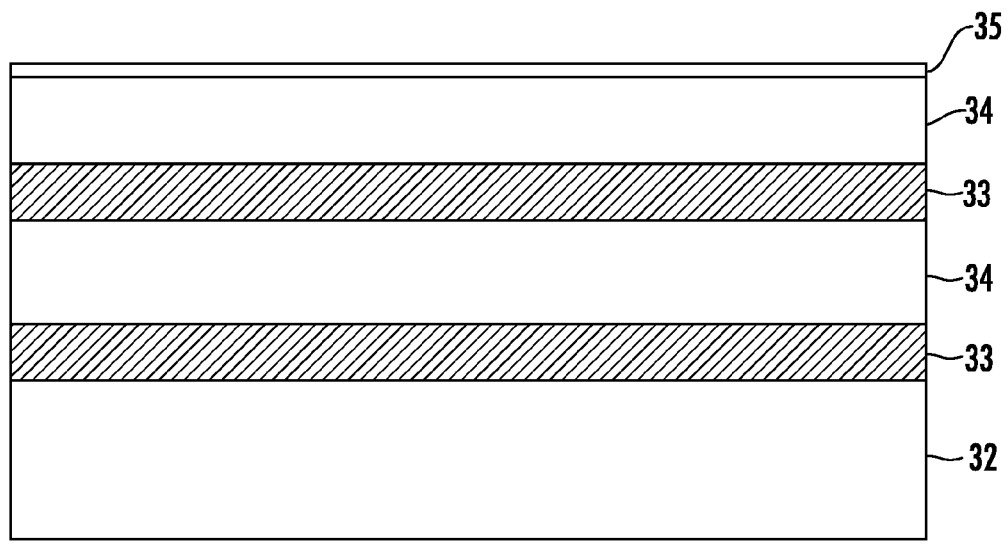
FIGS. 1-7 are a series of cross-sectional diagrams illustrating a method of making a semiconductor device including semiconductor nanowires in accordance with an example embodiment.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

By way of background, typical approaches for making stacked nanowire structures include, starting from a silicon substrate, performing a blanket epitaxial growth of multilayer stacks of SiGe/Si/SiGe/Si. A dedicated mask is used for nanowire patterning, such as through reactive ion etching (RIF). A "dummy" gate stack is then formed to provide mechanical stability for the nanowires when the SiGe is selectively removed, leaving the remaining silicon portions to form the stacked nanowires. A final gate stack may then be formed over the silicon nanowires.

However, this approach may have certain drawbacks. For example, this approach requires a dummy gate deposition and requisite patterning to stabilize the nanowires during selective removal of the SiGe, which adds additional processing steps and time. Furthermore, the mechanical stability of such an approach may be challenging, as it may be difficult to have relatively long nanowires which are unsupported during fabrication with this technique.

Referring to FIGS. 1-7, an improved approach for making a semiconductor device 30, such as a FINFET, including stacked groups of nanowires 31 is now described. The method begins with forming, above a substrate 32, a stack of alternating layers of first and second semiconductor materials 33, 34, where the second semiconductor material is different than the first. By way of example, the substrate 32 and the second semiconductor material layers 34 may be silicon, while the first layer 33 material may be SiGe, for example, although other suitable semiconductor materials may also be used in different embodiments. In the drawings, the first semiconductor layers 33 are indicated with cross-hatching for ease of reference. It should be noted that other types of substrates such as semiconductor on insulator (SOI), etc., may also be used in some embodiments.

A mask layer, e.g., a silicon nitride (SiN) layer 35, is formed on the top of the stack (i.e., on the top silicon layer 34). In the illustrated example, the stack includes two pairs of silicon/silicon germanium layers 34, 33 (i.e., four total layers), although a single pair, or more than two pairs, may be used in different embodiments. The silicon/SiGe layers 34, 33 may be epitaxially grown, as will be appreciated by those skilled in the art.

Figure 2:
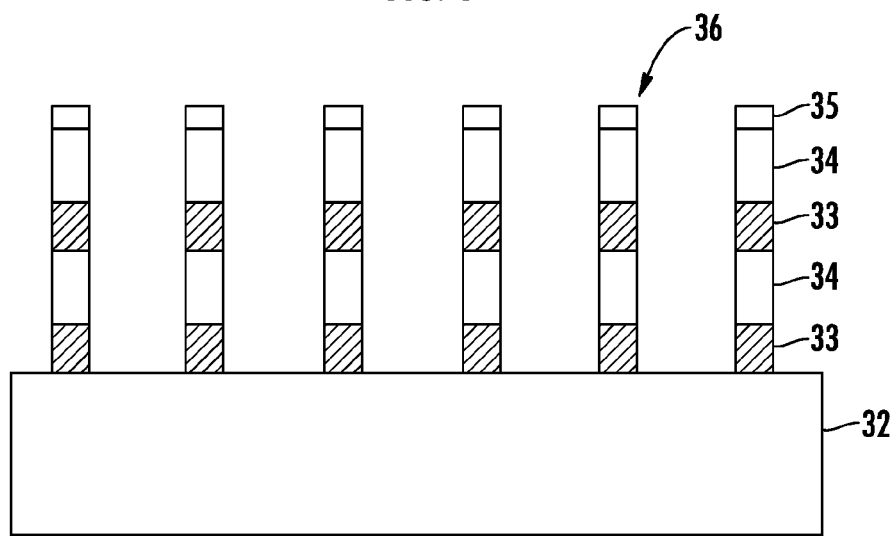

The method may further include forming a plurality of fins 36 from the stack, which may be done by patterning or etching (e.g., RIE, etc.) a series of trenches through the stack as seen in FIG. 2. As a result, each fin 36 will have alternating layers of the first and second semiconductor materials (i.e., silicon and SiGe).

Figure 3:
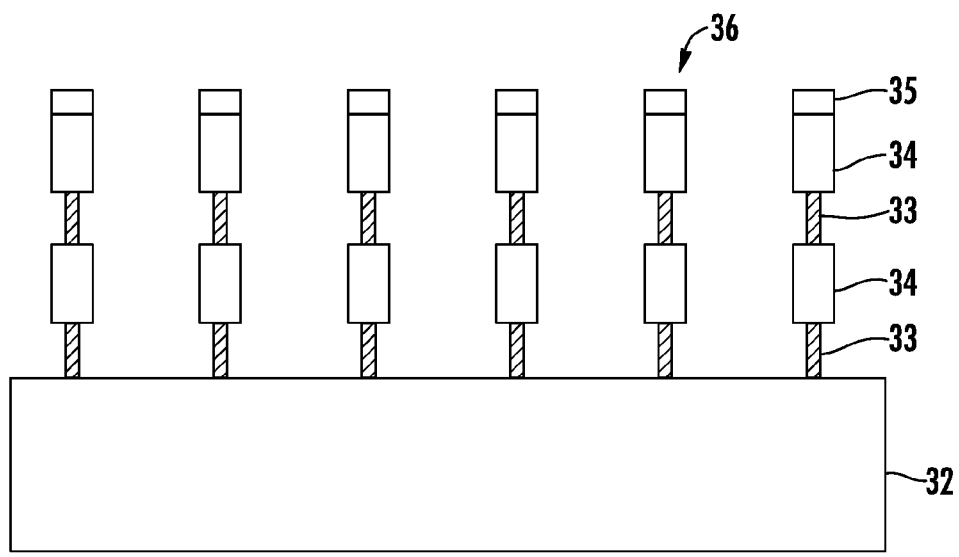

Sidewall portions of the second semiconductor material (i.e., SiGe) may then be selectively removed from the fins 36 to define recesses or notches therein, as shown in FIG. 3. That is, the width of the SiGe layer portions 33 of each fin 36 are narrowed through a selective etching process to remove as much SiGe as possible, while still leaving an adequate underlying support for the silicon layer portions 34. This selective sidewall etching or notching of the SiGe layer portions 33 may be performed using a wet etch (e.g., SC1) or dry etc. (e.g., HCl gas), for example. By way of example, each SiGe layer portion 33 may be in a range of 5 to 20 nm thick, and about 10 nm wide after formation of the fins 36. For this width, a sidewall thickness of about 2-5 nm, and more particularly about 3 nm, may be removed from the total width of the SiGe layer portions 33 (i.e., about 1-2.5 nm is notched out of each sidewall), although other dimensions may be used in different embodiments.

Figure 4:
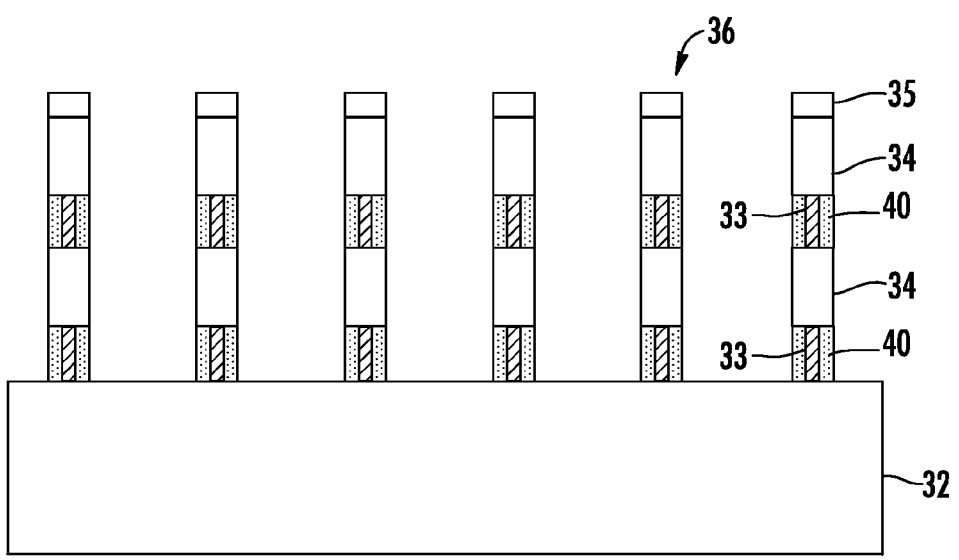

The method further includes forming a dielectric material (e.g., oxide or nitride) 40 within the recesses or notches adjacent the SiGe material portions 33. This passivates or otherwise encapsulates the SiGe within the fin 36, so that when excess portions of the oxide (or nitride) 40 are etched to form straight sidewall portions as shown in FIG. 4, no SiGe is exposed. In other words, the oxide 40 is etched in such a way that no oxide remains on the silicon sidewall portions 34 of the fins 36, but it does remain within the notches or recesses laterally surrounding the SiGe layer portions 33, as shown.

Figure 5:
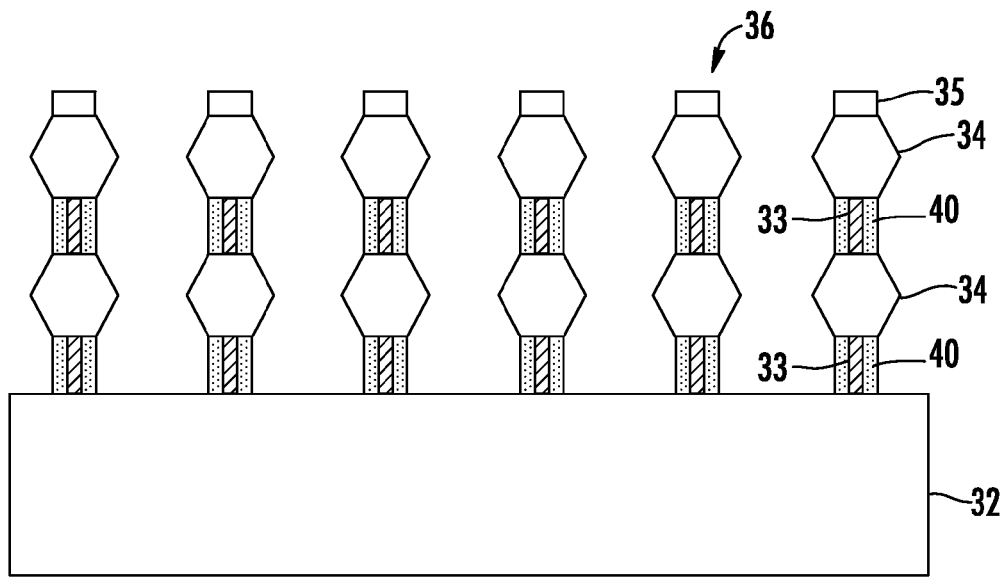

As such, additional silicon may be epitaxially grown on the sidewalls of the silicon layer portions 34, which laterally increases the widths of the silicon portions so that their cross-sectional shapes generally resemble hexagons, as shown in FIG. 5. The selective epitaxial silicon growth occurs only on the silicon layer portions 33, since the SiGe has been passivated or covered with the oxide 40, as will be appreciated by those skilled in the art. Thus, the cross-sectional area of the silicon layer portions 33 may advantageously be increased to the desired nanowire dimensions. It should be noted that this step will also result in some residual silicon growth on the substrate 32 between the fins 36, which will not affect the nanowire formation (so long as it is not overgrown to contact the silicon layer portions 34), and is therefore not shown in FIG. 5.

Figure 6:
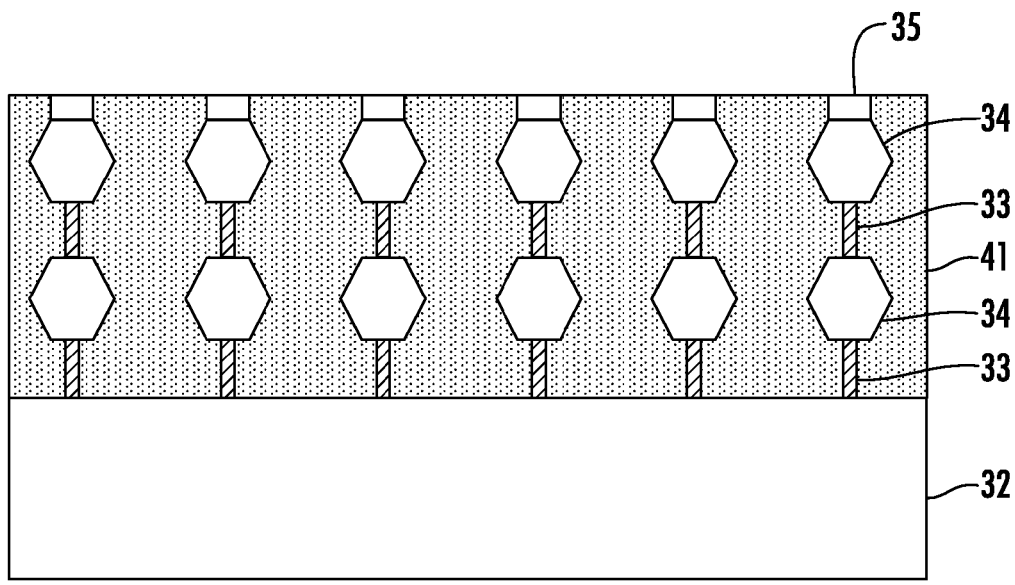

While the silicon layer portions 34 could be used as nanowires at this point, further performance enhancements may be realized by causing the silicon layer portions to have a more oval or rounded cross-sectional shape to provide a relatively even field distribution therein, as will be appreciated by those skilled the art. To do this, a dielectric layer 41 may be formed overlying the plurality of fins 36 to define nanowires 31 comprising the first semiconductor material within the dielectric layer. More particularly, a relatively thick oxide layer 41 may be deposited up to the top of the fins 36, as seen in FIG. 6, followed by chemical mechanical polishing (CMP) stopping on top of the SiN layer portion 35. The SiN layer portions 35 may be removed with a wet (e.g., $H_3PO_4$) or dry chemistry (e.g., reactive ion etching). Then, an additional thermal oxidization is performed to define the stacked nanowires 31, which have a more circular or oval-shaped cross section.

Moreover, the thermal oxidation will also result in diffusion of some residual germanium from the SiGe layer portions 33 into the nanowires 31, while the silicon from the SiGe layer portions will be oxidized as silicon dioxide during the thermal oxidation, as will be appreciated by those skilled in the art. It will therefore be appreciated that some or all of the nanowires 31 will include a residual portion of germanium therein, which may typically be less than 5% by weight of the overall semiconductor material in each nanowire, and more particularly about 1-3% by weight for a preferred embodiment.

This residual germanium will have a negligible effect on the conductivity of the silicon nanowires 31, e.g., such as for electron conductivity in an n-channel device, for example. Yet, the above-described approach advantageously provides a relatively easy way to stack nanowires 31 on the same wafer or substrate, without the need for an additional dummy gate formation prior to nanowire formation. Moreover, since the nanowires 31 are formed at the fin level, this provides a relatively robust and controllable integration, and which is compatible with the current technologies, as will be appreciated by those skilled in the art.

It should be noted that the above-described process may also be used to form nanowires 31 with different semiconductor materials. For example, the order of deposition of the silicon layers 34 and SiGe layers 33 may be reversed, with the silicon layer portions being notched as described above followed by SiGe sidewall growth to form SiGe hexagons (and, subsequently, more rounded SiGe nanowires). Moreover, silicon nanowire 31 stacks of different semiconductor materials may be formed on different regions of a same wafer or substrate, such as to form complementary devices (e.g., silicon nanowires for the n-channel devices, and SiGe for the p-channel devices). Moreover, semiconductors other than silicon and SiGe may also be used.

Figure 7:
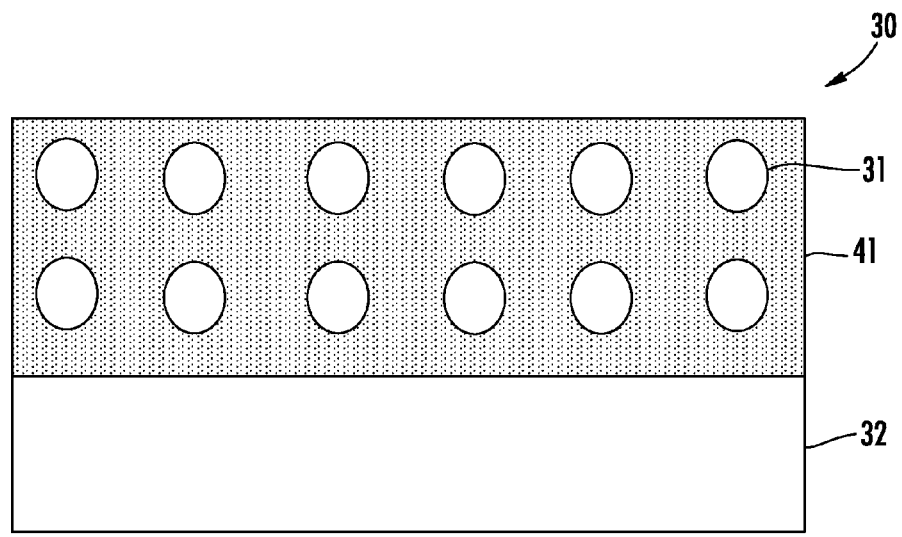
Figure 8:
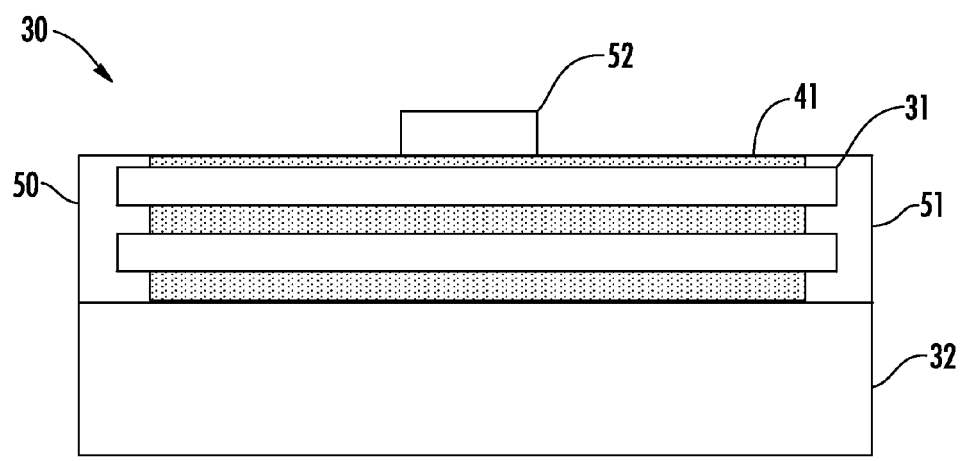
FIG. 8 is a cross-sectional diagram of a semiconductor device made using the method shown in FIGS. 1-7 taken along a longitudinal axis of the nanowires.

Once the nanowires 31 have been formed as seen in FIG. 7, additional conventional device processing steps may be performed. These steps may include source 50 and drain 51 formation, gate stack deposition (and optionally a replacement metal gate, RMG, module) to form a gate electrode 52, etc. (FIG. 8).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
   forming, above a substrate, a stack of alternating layers of silicon and silicon germanium;
   forming a plurality of fins from the stack, each fin having alternating layers of silicon and silicon germanium;
   selectively removing sidewall portions of the silicon germanium from the fins to define recesses therein;
   forming a dielectric material within the recesses;
   forming additional silicon on sidewall portions of the silicon in the fins;

forming a dielectric layer overlying the plurality of fins and performing a thermal oxidation to define nanowires from the silicon in the fins and the additional silicon within the dielectric layer, the nanowires comprising a residual portion of from 1 to 5% germanium by weight.

2. The method of claim 1 wherein the stack of alternating layers of silicon and silicon germanium comprises a plurality of pairs of layers of alternating silicon and silicon germanium; and wherein forming the dielectric layer comprises forming the dielectric layer to define vertically stacked groups of nanowires comprising silicon within the dielectric layer.

3. The method of claim 1 wherein the nanowires have oval-shaped cross-sections.

4. A method for making a semiconductor device comprising:
   forming, above a substrate, a stack of alternating layers of silicon and silicon germanium;
   forming a plurality of fins from the stack, each fin having alternating layers of silicon and silicon germanium;
   selectively removing sidewall portions of the silicon germanium from the fins to define recesses therein;
   forming an oxide within the recesses;
   forming additional silicon on sidewall portions of the silicon in the fins; and
   forming a dielectric layer overlying the plurality of fins and performing a thermal oxidation to define silicon nanowires within the dielectric layer, the nanowires comprising a residual portion of from 1 to 5% germanium by weight.

5. The method of claim 4 wherein the stack of alternating layers comprises a plurality of pairs of alternating silicon and silicon germanium layers; and wherein forming the oxide layer comprises forming the oxide layer to define vertically stacked groups of silicon nanowires each having the residual portion of silicon germanium within the dielectric layer.

6. The method of claim 4 wherein the silicon nanowires have oval-shaped cross-sections.

7. The method of claim 1 further comprising forming source, drain and gate electrodes to define at least one FIN-FET.

8. The method of claim 1 wherein the silicon nanowires have rounded cross-sections.

9. The method of claim 4 further comprising forming source, drain and gate electrodes to define at least one FIN-FET.

10. A method for making at least one FINFET comprising:
    forming, above a substrate, a stack of alternating layers of first and second semiconductor materials, the second semiconductor material being different than the first semiconductor material;
    forming a plurality of fins from the stack, each fin having alternating layers of the first and second semiconductor materials;
    selectively removing sidewall portions of the second semiconductor material from the fins to define recesses therein;
    forming a dielectric material within the recesses;
    forming additional first semiconductor material on sidewall portions of the first semiconductor material in the fins;
    forming a dielectric layer overlying the plurality of fins to define nanowires comprising the first semiconductor material within the dielectric layer so that each of the nanowires comprises a residual portion of the second semiconductor material comprising from 1 to 5% by weight of the overall semiconductor material in each nanowire; and
    forming source, drain and gate electrodes for the at least one FINFET.

11. The method of claim 10 wherein the stack of alternating layers of first and second semiconductor materials comprises a plurality of pairs of layers of alternating first and second materials; and wherein forming the dielectric layer comprises forming the dielectric layer to define vertically stacked groups of nanowires comprising the first semiconductor material within the dielectric layer.

12. The method of claim 10 wherein forming the dielectric layer further comprises depositing an oxide and thereafter performing a thermal oxidation.

13. The method of claim 10 wherein the nanowires have oval-shaped cross-sections.

14. The method of claim 10 wherein the first semiconductor material comprises silicon.

15. The method of claim 10 wherein the second semiconductor material comprises silicon germanium.

* * * * *